(12) United States Patent
Kim et al.

(10) Patent No.: US 10,844,248 B2
(45) Date of Patent: Nov. 24, 2020

(54) ADHESIVE COMPOSITION, ADHESIVE SHEET, AND BACK GRINDING METHOD FOR SEMICONDUCTOR WAFER

(71) Applicant: LG CHEM, LTD., Seoul (KR)

(72) Inventors: Se Ra Kim, Daejeon (KR); Yoon Jeong Baek, Daejeon (KR); Jang Soon Kim, Daejeon (KR); Jae Kwan Lee, Daejeon (KR); Hyun Woo Park, Chungcheongbuk-do (KR)

(73) Assignee: LG CHEM, LTD., Seoul (KR)

( * ) Notice: Subject to any disclaimer, the term of this patent is extended or adjusted under 35 U.S.C. 154(b) by 339 days.

(21) Appl. No.: 15/622,988

(22) Filed: Jun. 14, 2017

(65) Prior Publication Data

US 2017/0290217 A1 Oct. 5, 2017

Related U.S. Application Data

(63) Continuation of application No. 12/992,079, filed as application No. PCT/KR2009/002559 on May 14, 2009, now abandoned.

(30) Foreign Application Priority Data

May 14, 2008 (KR) .................. 10-2008-0044494

(51) Int. Cl.
*C09J 7/22* (2018.01)
*C09J 4/06* (2006.01)
(Continued)

(52) U.S. Cl.
CPC . *C09J 7/22* (2018.01); *C09J 4/06* (2013.01); *C09J 7/38* (2018.01); *C09J 133/04* (2013.01);
(Continued)

(58) Field of Classification Search
None
See application file for complete search history.

(56) References Cited

U.S. PATENT DOCUMENTS 5,814,685 A 9/1998 Satake et al.
5,817,426 A * 10/1998 Spada ............... C08F 220/18
428/483
(Continued)

FOREIGN PATENT DOCUMENTS

CN 1201478 A 12/1998
CN 1247382 A 3/2000
(Continued)

OTHER PUBLICATIONS

Office Action issued for European Patent Application No. 09746763.3 dated Sep. 21, 2017, 5 pages.
(Continued)

*Primary Examiner* — Frank D Ducheneaux
(74) *Attorney, Agent, or Firm* — Rothwell, Figg, Ernst & Manbeck, P.C.

(57) ABSTRACT

The present invention relates to a pressure-sensitive adhesive composition including a polymer of a monomer mixture containing isobornyl (meth)acrylate, a pressure-sensitive adhesive sheet, and a semiconductor wafer backgrinding method. In the present invention, by using isobornyl (meth)acrylate which is a hard-type monomer and has a low hydrophilic property, a pressure-sensitive adhesive composition having superior releasing and re-releasing properties and wettability with respect to the wafer, and having an excellent wafer-proofing property; a pressure-sensitive adhesive sheet prepared by using the pressure-sensitive adhesive composition; and a backgrinding method using the pressure-sensitive adhesive sheet can be provided.

18 Claims, 1 Drawing Sheet

(51) Int. Cl.
*C09J 133/04* (2006.01)
*C09J 133/08* (2006.01)
*C09J 133/10* (2006.01)
*H01L 21/683* (2006.01)
*C09J 7/38* (2018.01)

(52) U.S. Cl.
CPC ........... *C09J 133/08* (2013.01); *C09J 133/10* (2013.01); *H01L 21/6836* (2013.01); *C09J 2203/326* (2013.01); *C09J 2301/302* (2020.08); *C09J 2423/006* (2013.01); *C09J 2427/006* (2013.01); *C09J 2433/00* (2013.01); *C09J 2467/006* (2013.01); *C09J 2475/006* (2013.01); *H01L 2221/6834* (2013.01); *H01L 2221/68327* (2013.01); *Y10T 428/2891* (2015.01)

(56) References Cited

U.S. PATENT DOCUMENTS

| | | | |
|---|---|---|---|
| 6,037,054 | A | 3/2000 | Shirai et al. |
| 6,660,354 | B2 * | 12/2003 | Suwa .................. C09J 7/40 428/41.8 |
| 6,686,425 | B2 | 2/2004 | Wigdorski et al. |
| 6,861,141 | B2 | 3/2005 | Buccellato et al. |
| 6,939,911 | B2 | 9/2005 | Tosaki et al. |
| 7,070,051 | B2 | 7/2006 | Kanner et al. |
| 7,863,182 | B2 | 1/2011 | Matsumura et al. |
| 2001/0027245 | A1 | 10/2001 | Moroishi et al. |
| 2005/0244631 | A1 | 11/2005 | Sugimoto et al. |
| 2005/0261433 | A1 | 11/2005 | Takeko et al. |
| 2005/0269717 | A1 | 12/2005 | Ohashi et al. |
| 2006/0057366 | A1 | 3/2006 | Husemann et al. |
| 2007/0196647 | A1 * | 8/2007 | Yokoyama ............. B32B 7/12 428/355 AC |
| 2007/0231570 | A1 | 10/2007 | Tanaka et al. |
| 2008/0085409 | A1 | 4/2008 | Kiuchi et al. |
| 2008/0233374 | A1 | 9/2008 | Lechthaler et al. |
| 2011/0091676 | A1 | 4/2011 | Kim et al. |
| 2011/0177262 | A1 | 7/2011 | Kim et al. |

FOREIGN PATENT DOCUMENTS

| | | |
|---|---|---|
| CN | 1572852 A | 2/2005 |
| CN | 1912038 A | 2/2007 |
| EP | 1 858 999 A1 | 11/2007 |
| EP | 2267090 A2 | 12/2010 |
| JP | 2000-090495 A | 3/2000 |
| JP | 2003-338535 A | 11/2003 |
| JP | 2005-015524 A | 1/2005 |
| JP | 2005-116652 A | 4/2005 |
| JP | 2005-314453 A | 11/2005 |
| JP | 2006-509063 A | 3/2006 |
| JP | 2006-202926 A | 8/2006 |
| JP | 2006-216721 A | 8/2006 |
| JP | 2006-335860 A | 12/2006 |
| JP | 2007-045965 A | 2/2007 |
| JP | 2007-091773 A | 4/2007 |
| JP | 2007-100064 A | 4/2007 |
| JP | 2007-238802 A | 9/2007 |
| JP | 2009-231629 A | 10/2009 |
| KR | 2001-0019894 A | 3/2001 |
| KR | 2004-0041071 A | 5/2004 |
| KR | 2004-0071367 A | 8/2004 |
| TW | 200504170 A | 2/2005 |
| TW | 200728422 A | 8/2007 |
| WO | 2006/091088 A1 | 8/2006 |
| WO | 2007/144894 A1 | 12/2007 |

OTHER PUBLICATIONS

Aldrich Data Sheet (2013).
"Handbook of Pressure Sensitive Adhesive Products and Technology", (Sep. 1, 2004).
Zhang, M., et al., "Preparation of high oil-absorptive uniform gel with controllable oil-absorbency by radiation" Royal Society of Chemistry, 2017, 7, 31519-31524.

* cited by examiner

ADHESIVE COMPOSITION, ADHESIVE SHEET, AND BACK GRINDING METHOD FOR SEMICONDUCTOR WAFER

CROSS-REFERENCE TO RELATED APPLICATIONS

This application is a Continuation of U.S. patent application Ser. No. 12/992,079 filed on Feb. 15, 2011, which is a 35 U.S.C. § 371 National Phase Entry Application from PCT/KR2009/002559, filed on May 14, 2009, and designating the United States, which claims priority under 35 U.S.C. § 119 to Korean Patent Application No. 10-2008-0044494, filed on May 14, 2008, the entire disclosures of which are incorporated herein by reference.

TECHNICAL FIELD

The present invention relates to a pressure-sensitive adhesive composition, a pressure-sensitive adhesive sheet prepared by using the pressure-sensitive adhesive composition, and a backgrinding method using the pressure-sensitive adhesive sheet.

BACKGROUND ART

With the recent tendency towards miniaturization and weight-reduction of electronic products, there is an increasing demand for leadless, thin-film, and high-integration chip semiconductor packages. To meet the demand, a need for large-diameter thin-film wafers included in the semiconductor packages is also increasing.

In order to effectively cope with the tendency towards large diameter thin-film semiconductor wafers, it is important to precisely control a backgrinding process, which is a wafer grinding process, and a dicing process, which is a reorganizing process. To this end, high-performance techniques capable of controlling these processes are required. The backgrinding process involves mechanically or chemically polishing the surface of a wafer having a high-integration interconnection circuit to make the wafer thin. In this process, for example in the case of an 8-inch wafer, it is common to grind the wafer to about 200 μm to 400 μm, which is about half of the pre-process thickness. However, with the demand for thin-film wafers, it is currently necessary to grind a wafer to 200 μm or less, and thus a protective film is often used not only to protect the thin-film wafer during grinding, but also as a reinforcement for handling the thin-film wafer. Moreover, as the diameter of the wafer increases, wafer damage such as wafer contamination and cracks frequently occur during the backgrinding process. In this regard, the role of a wafer processing protective film is regarded as important.

Japanese laid-open patent No. 2006-169496 discloses a re-releasable waterborne acrylic pressure-sensitive adhesive sheet, which has a pressure-sensitive adhesive including an acrylic emulsion type copolymer as a main component and has limited physical properties such as elastic modulus, maximum strength, and gel fraction.

Japanese laid-open patent No. Hei 06-77193 discloses a wafer processing tape in which an emulsion-type pressure-sensitive adhesive that is prepared by adding a reactive surfactant to a monomer mixture including a silicon monomer and polymerizing the mixture is applied to a base. Japanese laid-open patent Nos. Hei 06-77194 and Hei 06-73347 disclose respectively a wafer processing tape prepared by an emulsion-type acrylic resin having a fluorine surfactant added thereto and a wafer processing tape prepared by emulsion-type acrylic resin having a silicon surfactant added thereto.

The foregoing techniques all use waterborne pressure-sensitive adhesives and are characterized by regulating a surfactant, a monomer, or a crosslinking agent within a pressure-sensitive adhesive composition or regulating other physical properties to apply a water-proofing property.

However, details disclosed in the foregoing arts are limited to waterborne or emulsion-type pressure-sensitive adhesives and are difficult to apply to solvent pressure-sensitive adhesives. Therefore, it is necessary to develop a technique which can be applied to any type of pressure-sensitive adhesive, regardless of whether they are solvent or aqueous pressure-sensitive adhesives, and also add an excellent wafer-proofing property, a releasing property, and wettability to the pressure-sensitive adhesives.

DISCLOSURE

Technical Problem

The present invention has been made considering the foregoing problems of the prior art, and an object of the present invention is to provide a pressure-sensitive adhesive composition having superior releasing and re-releasing properties and excellent wettability with respect to a wafer, and having an excellent water-proofing property; a pressure-sensitive adhesive sheet prepared by using the pressure-sensitive adhesive composition; and a backgrinding method using the sheet.

Technical Solution

The present invention provides, as a means for achieving the foregoing object, a pressure-sensitive adhesive composition including a polymer of a monomer mixture, the monomer mixture including a (meth)acrylic acid ester monomer containing isobornyl (meth)acrylate and a crosslinkable monomer comprising at least one functional group selected from the group consisting of a hydroxy group, a carboxyl group, and a nitrogen-containing functional group.

The present invention provides, as another means for achieving the foregoing object, a pressure-sensitive adhesive sheet including a base film and a pressure-sensitive adhesive layer that is formed on one or both sides of the base film, and contains a cured product of the pressure-sensitive adhesive composition according to the present invention.

The present invention provides, as still another means for achieving the foregoing object, a backgrinding method including a first step of adhering the pressure-sensitive adhesive sheet according to the present invention to a semiconductor wafer and a second step of grinding a back side of the semiconductor wafer to which the pressure-sensitive adhesive sheet is adhered.

Advantageous Effects

In the present invention, by using isobornyl (meth)acrylate which is a hard-type monomer and has a low hydrophilic property, a pressure-sensitive adhesive composition having superior releasing and re-releasing properties and wettability with respect to the wafer, and having an excellent water-proofing property; a pressure-sensitive adhesive sheet prepared by using the composition; and a backgrinding method using the sheet can be provided. The pressure-sensitive adhesive composition according to the present invention, when applied as, for example, a protective film for a semiconductor processing process, can prevent contamination or damage of a wafer due to water or other foreign substances applied during a backgrinding process, can be easily re-released after grinding, and can remarkably improve productivity.

BEST MODE

Figure 1:
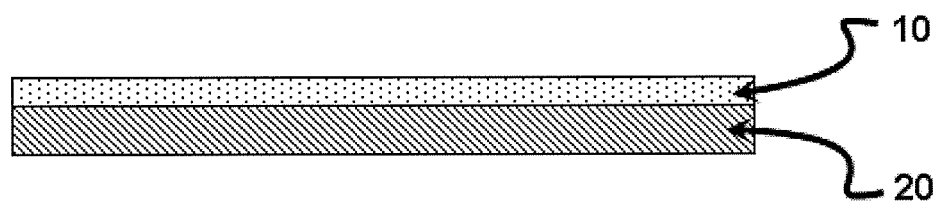
FIG. 1 is a cross-sectional view of a pressure-sensitive adhesive sheet according to an embodiment of the present invention.

The present invention relates to a pressure-sensitive adhesive composition including a polymer of a monomer mixture, the monomer mixture including:

(meth)acrylic acid ester monomer containing isobornyl (meth)acrylate; and a crosslinkable monomer including at least one functional group selected from the group consisting of a hydroxy group, a carboxyl group, and a nitrogen-containing functional group.

Hereinafter, a pressure-sensitive adhesive composition according to the present invention will be described in detail.

The polymer included in the pressure-sensitive adhesive composition according to the present invention includes isobornyl (meth)acrylate as a monomer component, and has a glass transition temperature of preferably −50° C. to 15° C. If the glass transition temperature of the polymer is less than −50° C., it is apprehended that release strength increases by a large amount according to the speed of release and thus, for example, release strength at a typical release speed (about 1.0 m/min) for a wafer processing process excessively increases, causing damage to a wafer. Moreover, if the glass transition temperature exceeds 15° C., it is apprehended that wettability to an adherend such as a semiconductor wafer is degraded or lifting occurs.

In the present invention, the polymer may have a weight average molecular weight of preferably 50,000 to 700,000. If the weight average molecular weight of the polymer is less than 50,000, it is apprehended that contamination occurs due to transfer caused by degradation in the cohesive strength of the pressure-sensitive adhesive. If the weight average molecular weight of the polymer exceeds 700,000, it is apprehended that the pressure-sensitive adhesive property may be deteriorated.

As mentioned above, the polymer according to the present invention includes, as a monomer component, a (meth) acrylic acid ester monomer containing isobornyl (meth) acrylate. The term "(meth)acrylic acid ester monomer containing isobornyl (meth)acrylate" means a monomer or a monomer mixture including isobornyl (meth)acrylate alone or another (meth)acrylic acid ester monomer (hereinafter referred to as a second monomer) together with the isobornyl (meth)acrylate. Isobornyl (meth)acrylate is a hard-type monomer having a high glass transition temperature and a low hydrophilic property. Thus, the isobornyl (meth)acrylate may lower the release strength of the pressure-sensitive adhesive to a proper level and maintain an excellent waterproofing property. That is, the isobornyl (meth)acrylate may give high crosslinking density to the pressure-sensitive adhesive and maintain the optimal level of the pressure-sensitive adhesive strength, while giving an excellent waterproofing property.

In an embodiment of the present invention, there is no special limitation in the type of the second monomer which may be included in the (meth)acrylic acid ester monomer. In the present invention, for example, alkyl (meth)acrylate may be used as the second monomer. If an alkyl group included in the second monomer is an excessively long chain, the cohesive strength of the pressure-sensitive adhesive may be degraded and the glass transition temperature ($T_g$) or pressure-sensitive adhesive property may become difficult to regulate. Therefore, it is desirable to use a (meth)acrylic acid ester monomer having an alkyl group of 1 to 12 carbon atoms. Examples of such a monomer include methyl (meth) acrylate, ethyl (meth)acrylate, n-propyl (meth)acrylate, isopropyl (meth)acrylate, n-butyl (meth)acrylate, t-butyl (meth) acrylate, sec-butyl (meth)acrylate, pentyl (meth)acrylate, 2-ethylhexyl (meth)acrylate, 2-ethylebutyl (meth)acrylate, n-octyl (meth)acrylate, isooctyl (meth)acrylate, isononyl (meth)acrylate, lauryl (meth)acrylate, and tetradecyl (meth) acrylate, and in the present invention, they can be used alone or in a mixture of one kind or two or more kinds thereof.

In an embodiment of the present invention, for example, the second monomer may be a copolymerizable monomer having a lower glass transition temperature than the isobornyl (meth)acrylate. By mixing such a monomer with the isobornyl (meth)acrylate, the wettability of the pressure-sensitive adhesive to the wafer surface, and the waterproofing and re-releasing properties of the pressure-sensitive adhesive can be further improved. However, the foregoing formulation is only one example of a monomer composition for preparing the polymer according to the present invention, and the monomer composition is not specifically limited if the polymer includes isobornyl (meth)acrylate as a monomer component and satisfies the glass transition temperature in the foregoing range.

In the present invention, when the (meth)acrylic acid ester monomer includes isobornyl (meth)acrylate and the second monomer, it may include 1 to 30 parts by weight of isobornyl (meth)acrylate and 60 to 98.9 parts by weight of the second monomer, and preferably may include 5 to 25 parts by weight of isobornyl (meth)acrylate and 65 to 93.9 parts by weight of the second monomer. If the content of the isobornyl (meth)acrylate is less than 1 part by weight, the effect of improving the water-proofing property may be degraded. If the content exceeds 30 parts by weight, smooth release may not be provided during a release process or a stick-slip phenomenon may occur.

If the content of the second monomer is less than 60 parts by weight, the initial adhesive strength of the pressure-sensitive adhesive may be lowered. If the content exceeds 98.9 parts by weight, a problem may occur in endurance due to degradation of the cohesive strength.

The crosslinkable monomer included in the monomer mixture according to the present invention may add a functional group capable of reacting with, for example, a multifunctional crosslinking agent to be described below to the polymer so as to form a crosslinking structure through thermal curing, thereby regulating the endurance reliability, pressure-sensitive adhesive strength, and cohesive strength of the pressure-sensitive adhesive. That is, the pressure-sensitive adhesive composition according to the present invention may be formulated as a thermal-curiable composition by including the crosslinkable monomer and the crosslinking agent to be described below.

The type of crosslinkable functional group that can be included in the crosslinkable monomer is not specifically limited if it can form a crosslinking structure by a thermal curing method, and examples of the crosslinking functional group include a hydroxy group, a carboxyl group, and a nitrogen-containing functional group. In other words, in an embodiment of the present invention, the crosslinkable monomer may be a hydroxy group-containing monomer, a carboxyl group-containing monomer, or a nitrogen-containing monomer. Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxylethyleneglycol (meth)acrylate, and 2-hydroxyphrophyleneglycol (meth)acrylate. Examples of the carboxyl group-containing monomer include (meth)acrylic acid, 2-(meth)acryloyloxy acetic acid, 3-(meth)acryloyloxy propyl acid, 4-(meth)acryloyloxy butyl acid, an acrylic acid dimer, itaconic acid, maleic acid, and maleic anhydride. Examples of the nitrogen-containing monomer include (meth)acryl amide, N-vinyl pyrrolidone, and N-vinyl caprolactam, without being limited thereto. In the present invention, they can be used alone or in a mixture of one kind or two or more kinds thereof.

The monomer mixture according to the present invention preferably includes 90 to 99.9 parts by weight of the (meth)acrylic acid ester monomer and 0.1 to 10 parts by weight of the crosslinkable monomer. If the content of the crosslinkable monomer is less than 0.1 parts by weight, the endurance reliability of the pressure-sensitive adhesive may be degraded. If the content exceeds 10 parts by weight, the pressure-sensitive adhesive property and/or the release strength may be lowered.

The monomer mixture according to the present invention may further include a copolymerizable monomer having a relatively high glass transition temperature in order to further improve pressure-sensitive adhesive strength and cohesive strength. The type of copolymerizable monomer that can be included in the monomer mixture is not specifically limited, if it can improve the pressure-sensitive adhesive strength and cohesive strength of the pressure-sensitive adhesive, and for example, it may be a compound expressed by:

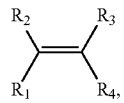

[Formula 1]

where $R_1$ to $R_3$ independently indicate hydrogen or alkyl; $R_4$ indicates cyano, phenyl unsubstituted or substituted with alkyl, acetyloxy, or $COR_5$; where $R_5$ indicates amino or glycidyloxy either unsubstituted or substituted with alkyl or alkoxy alkyl.

In the definitions of $R_1$ to $R_5$, alkyl or alkoxy means an alkyl or alkoxy of 1 to 8 carbon atoms, preferably methyl, ethyl, methoxy, ethoxy, propoxy, or butoxy.

Detailed examples of the monomer expressed by Formula 1 may include, but are not limited to, one or two or more kinds of a (meth)acrylate such as methyl (meth)acrylate or ethyl (meth)acrylate; a nitrogen-containing monomer such as (meth)acrylonitrile, (meth)acryl amide, N-methyl (meth) acryl amide, or N-butoxy methyl (meth)acryl amide; a styrene monomer such as styrene or methyl styrene; glycidyl (meth)acrylate; or a carbonic acid vinyl ester such as vinyl acetate. When the copolymerizable monomer is included in the monomer mixture, its content is preferably less than 20 parts by weight relative to the content of the (meth)acrylic ester monomer or the crosslinkable monomer. If the content is in excess of 20 parts by weight, the flexibility and/or peeling strength of a pressure-sensitive adhesive composition may be degraded.

In the present invention, a method of preparing the pressure-sensitive adhesive polymer of the monomer mixture is not specifically limited, and for example, may be general polymerization such as solution polymerization, photo-polymerization, bulk polymerization, suspension polymerization, or emulsion polymerization. In the present invention, the polymer may be prepared by solution polymerization using a thermal initiator. When the polymer is prepared in this way, the process can be facilitated and the polymer can have superior uniformity. The solution polymerization is preferably performed at a polymerization temperature of 50° C. to 140° C. by adding an initiator in a state where monomers are evenly mixed. Examples of the initiator that can be used may include common initiators like an azo-based polymerization initiator such as azo-bisisobutyronitrile or azobiscyclohexanecarbonitrile; and/or peroxide such as benzoyl peroxide and acetyl peroxide, and they can be used alone or in a mixture of one kind or two or more kinds thereof.

The pressure-sensitive adhesive composition according to the present invention may further include 0.1 to 10 parts by weight of a crosslinking agent (curing agent) with respect to 100 parts by weight of the polymer in addition to the foregoing components. The crosslinking agent can regulate the pressure-sensitive adhesive property of the pressure-sensitive adhesive according to the amount used. The crosslinking agent may also improve the cohesive strength of the pressure-sensitive adhesive by reacting with the crosslinking functional group included in the pressure-sensitive adhesive polymer.

The detailed type of the crosslinking agent that can be used in the present invention is not specially limited, if it can form a crosslinking structure by a thermal curing process, and for example, may be an isocyanate compound, an epoxy compound, an aziridine compound, or a metal chelate compound. The isocyanate compound may be one or more selected from a group consisting of toluene diisocyanate, xylene diisocyanate, diphenylmethane diisocyanate, hexamethylene diisocyanate, isophorone diisocyanate, tetramethylxylene diisocyanate, naphthalene diisocyanate, and reactants with at least one of the foregoing diisocyante and polyol such as trimethyloipropane. The epoxy compound may be one or more selected from a group consisting of ethyleneglycol diglycidylether, triglycidylether, trimethylolpropane triglycidylether, N,N,N',N'-tetraglycidylethylenediamine, and glycerine diglycidylether. The aziridine compound may be one or more selected from a group consisting of N,N'-toluene-2,4-bis(1-aziridinecarboxide), N,N'-diphenylmethane-4,4'-bis(1-aziridinecarbodixe), triethylenemelamine, bisisoprothaloyl-1-(2-methylaziridine), and tri-1-aziridinylphosphineoxide. The metal chelate compound may be compounds in which a multivalent metal such as Al, Fe, Zn, Sn, Ti, Sb, Mg, and/or V is coordinated to compound such as acethylacetone or ethyl acetoacetate, without being limited thereto.

Such a crosslinking agent is included in an amount of preferably 0.1 to 10 parts by weight with respect to 100 parts by weight of the pressure-sensitive adhesive polymer. If the content is less than 0.1 parts by weight, cohesion failure may occur under a high temperature or high humidity condition due to reduction of the cohesive strength of the pressure-sensitive adhesive. If the content exceeds 10 parts by weight, endurance reliability may be deteriorated, resulting in inter-layer release or lifting; or compatibility or the flow feature may be degraded.

In a range that does not have an influence upon the effect of the present invention, the pressure-sensitive adhesive composition according to the present invention may further include one or more additives selected from a group consisting of a tackifier resin, an initiator, low-molecular weight materials, an epoxy resin, a curing agent, an ultraviolet (UV) stabilizer, antioxidants, a coloring agent, a reinforcing agent, an antifoaming agent, a surfactant, a foaming agent, an organic salt, a thickening agent, and a flame retardant.

The present invention also relates to a pressure-sensitive adhesive sheet including a base film; and a pressure-sensitive adhesive layer that is formed on one or both sides of the base film, and contains a cured product of the pressure-sensitive adhesive composition according to the present invention.

FIG. 1 is a cross-sectional view showing a pressure-sensitive adhesive sheet in which a pressure-sensitive adhesive layer 10 is formed on a side of a base film 20 according to an embodiment of the present invention.

The pressure-sensitive adhesive sheet according to the present invention may be used, for example, as a semiconductor processing sheet such as a protective film during semiconductor wafer backgrinding. In particular, the pressure-sensitive adhesive sheet according to the present invention is prepared from the pressure-sensitive adhesive composition, and thereby can effectively prevent contamination or damage of the wafer, caused by water or foreign substances during backgrinding, due to its superior wettability to the wafer, re-release property, and especially the excellent water-proofing property.

The type of base film used in the pressure-sensitive adhesive sheet according to the present invention is not specially limited, and a base film having a toughness of less than 240 Kg·mm, or preferably 210 Kg·mm or less at about 23° C., preferably 20° C. to 25° C., and more preferably 15° C. to 30° C., may be used. The term "toughness" as used herein refers to a value measured by a tensile test, specifically, a value indicating the degree of hardness and softness of a material.

The toughness of the base film may be measured, for example, by the following method: Firstly, a specimen in the shape of a predetermined-size film is manufactured as a base film to be subject to a toughness measurement. The specimen may be in the shape of a film, and have, for example, a length of about 15 mm and a width of about 15 mm. The said sizes of the specimen such as length and width refer to the size of portions other than portions to be taped for fixation of the specimen.

After the specimen is manufactured under the foregoing conditions, the specimen is installed such that the lengthwise direction of the specimen is orthogonal to a machine (tensile tester) direction and a force is applied in the lengthwise direction at a tensile speed of about 180 mm/min to about 220 mm/min, and preferably about 200 mm/min. Then a graph of the force with respect to distance until the specimen is torn is expressed as a graph of elongation (X axis) and tensile strength (Y axis) by applying the width and thickness of the film (specimen). When the tensile curve is made in the foregoing manner, the tensile modulus may be measured from the initial slope of the curve, and the toughness may be measured by the area of the curve.

In the present invention, if the toughness is more than 240 Kg·mm, the film may be excessively hard and its cutting property may be degraded due to an increase in the elastic modulus of the base film. Moreover, if the toughness of the base film excessively increases, the cushioning property may be weakened and thus, for example, when the film is applied to the wafer backgrinding process, the stress-relaxing effect of the film is deteriorated, causing a reduction in grinding precision or wafer damage.

In the present invention, a lower limit of the toughness of the base film is not specifically limited as long as it is within the above-mentioned range. However, if the toughness of the base film is too small, excessive softening of the film occurs, causing cracks or damage to the wafer when the film is wound around a roll or the wound film is released from the roll to be adhered to the wafer. Thus, in the present invention, the toughness of the base film may be adjusted properly in a range of 60 Kg·mm or more.

The detailed type of base film used in the present invention is not specifically limited, and for example, a general material such as synthetic rubber, synthetic resin, or natural resin may be used without limit. In the present invention, more detailed examples of the base film may include one kind or two or more kinds of a polyethylene film, an ethylene-vinyl acetate copolymer film, an ethylene-alkyl (meth)acrylate copolymer film (the alkyl group preferably has 1 to 4 carbon atoms), an ethylene-α-olefin copolymer film, a propylene-α-olefin copolymer film, a polyolefine film (e.g., polypropylene), a polyester film (e.g., a polyethylene terephthalate film or a polybutylene terephthalate film), a polyvinyl chloride film, a polyester elastomer, and an urethane film. The base film of two or more kinds may mean one which is made of a lamination of two or more kinds of the above examples or is made from a blend of two or more resins from the above examples. Such a base film can be prepared by a general method known in this field, and representative preparation methods may include, but are not limited to, T-die extrusion, inflation, and calendaring.

In the present invention, the thickness of the base film is appropriately selected according to the usage of the base film without being specifically limited, and for example, may be 10 μm to 500 μm, and preferably 50 μm to 300 μm. The base film according to the present invention preferably has an appropriate storage modulus in terms of the efficiency of the semiconductor processing process, and for example, it may have a storage modulus of $1\times10^7$ Pa to $1\times10^9$ Pa at a temperature of $-10°$ C. to 100° C., and preferably about 20° C.

In the present invention, surface treatment such as primer treatment or corona treatment may be performed on the base film to improve close adhesion to a pressure-sensitive adhesive layer, and a proper color may be added for efficient semiconductor processing.

A method of forming a pressure-sensitive adhesive layer on the base film is not specifically limited. For example, in the present invention, the method may include applying the aforementioned pressure-sensitive adhesive composition to the base film and then curing the resultant, or forming the pressure-sensitive adhesive layer by applying the pressure-sensitive adhesive composition to a release base and then transferring the pressure-sensitive adhesive layer to the base film. In the present invention, a method of applying the pressure-sensitive adhesive composition to the base film or the release base surface is not specially limited, and for example, a means such as a bar coater, a knife coater, a roll coater, a spray coater, a gravure coater, a curtain coater, a comma coater and/or a lip coater may be used to perform the application. In the present invention, a method of curing the pressure-sensitive adhesive composition is not specially limited, either, and general thermal curing or photo-curing may be used, and preferably thermal curing is used. By forming the pressure-sensitive adhesive through thermal curing, the process efficiency can be improved and the prepared pressure-sensitive adhesive can have excellent uniformity in comparison to the formation through photo-curing.

More specifically, in the present invention, the method includes applying the pressure-sensitive adhesive composition to the base film, drying and then aging it, or applying the pressure-sensitive adhesive composition to the release base surface, drying it, transferring the pressure-sensitive adhesive layer formed on the release base film to the base surface and then aging it.

In the present invention, it is desirable to adjust the crosslinking structure of the pressure-sensitive adhesive layer through proper drying and aging processes at the pressure-sensitive adhesive formation stage. By adjusting the crosslinking structure, it is possible to obtain a pressure-sensitive adhesive layer having elasticity and strong cohesion, thus improving the pressure-sensitive adhesive property, such as endurance reliability, and the cutting property of the pressure-sensitive adhesive film. More specifically, the pressure-sensitive adhesive layer of the pressure-sensitive adhesive sheet preferably has a crosslinking density of 80 to 99%. If the crosslinking density of the pressure-sensitive adhesive layer is less than 80%, the cohesive strength of the pressure-sensitive adhesive layer is degraded and the pressure-sensitive adhesive component is transferred to the adherend such as the water, causing residues. If the crosslinking density is in excess of 99%, the peeling strength is reduced, resulting in immersion due to water spray during wafer processing.

The thickness of the pressure-sensitive adhesive layer of the pressure-sensitive adhesive sheet according to the present invention is preferably 0.5 µm to 50 µm, and more preferably 1 µm to 30 µm. If the thickness is out of this range, it is difficult to obtain a uniform pressure-sensitive adhesive layer, making the physical properties of the film non-uniform.

Figure 2:
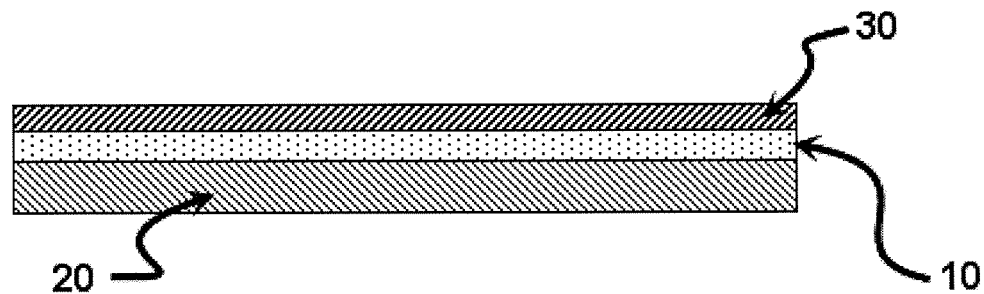
FIG. 2 is a cross-sectional view of a pressure-sensitive adhesive sheet according to another embodiment of the present invention.

In the pressure-sensitive adhesive sheet according to the present invention, to prevent foreign substances from entering the pressure-sensitive adhesive layer, a release film may be formed on the pressure-sensitive adhesive layer. FIG. 2 is a cross-sectional view showing a pressure-sensitive adhesive sheet according to an embodiment of the present invention, in which the pressure-sensitive adhesive layer 10 is formed on a side of the base film 20 and a release film 30 is formed on the pressure-sensitive adhesive layer 10. The detailed type of release film is not specifically limited, and for example, a film obtained by releasing-treating one side or both sides of a polyethyleneterephthalate (PET) film or an olefin film with a silicon or alkyd releasing agent may be used. The thickness of the release film is set properly according to the usage without being specifically limited, and may be selected in a range of 10 µm to 70 µm.

The present invention also relates to a backgrinding method including:

a first step of adhering the foregoing pressure-sensitive adhesive sheet according to the present invention to a semiconductor wafer; and a second step of grinding a back of the semiconductor wafer to which the pressure-sensitive adhesive sheet is adhered.

The backgrinding method is characterized by using the pressure-sensitive adhesive film according to the present invention as a wafer processing protective film, and other detailed processing conditions are not specifically limited. For example, in the present invention, the backgrinding process may be performed after adhering the pressure-sensitive adhesive film to the wafer by means of a press or hot roll laminate method and fixing it to a grinding tool such as a grinder. As described above, the pressure-sensitive adhesive film according to the present invention can be effectively applied to the backgrinding process with its superior wettability to the wafer and excellent peeling and water resistance properties. In the grinding method according to the present invention, general semiconductor packaging processes such as wafer dicing, die-bonding, wire-bonding and molding can be performed continuously from the backgrinding process, and detailed conditions are not specifically limited.

Mode for Invention

Hereinafter, the present invention will be described in more detail with reference to examples according to the present invention and comparative examples which are not in accordance with the present invention, but the scope of the present invention is not limited by the examples to be described below.

EXAMPLE 1

A monomer mixture (100 parts by weight) comprising isobornyl acrylate, methyl acrylate, ethyl acrylate, n-butyl acrylate and 2-hydroxyethyl acrylate was prepared such that 5 parts by weight of isobornyl acrylate (IBOA) were contained in the mixture, and the glass transition temperature of the polymer prepared from the mixture was −25° C. Then, the monomer mixture was polymerized to prepare an acrylic pressure-sensitive adhesive polymer having a solid content of 45 weight %. Next, an isocyanate cross-linking agent was added to the prepared pressure-sensitive adhesive polymer in an amount of 2 parts by weight, relative to 100 parts by weight of the pressure-sensitive adhesive polymer. The resultant was applied to an ethylene-acetic acid vinyl copolymer film having a thickness of 80 µm, and then dried, thus preparing a pressure-sensitive adhesive layer (thickness: 20 µm). The prepared pressure-sensitive adhesive sheet was aged for 2 hours at 50° C., and then subjected to tests to be described below.

EXAMPLE 2

Except for the fact that a monomer mixture (100 parts by weight) comprising isobornyl acrylate, methyl acrylate, ethyl acrylate, n-butyl acrylate and 2-hydroxyethyl acrylate was used such that 10 parts by weight of isobornyl acrylate (IBOA) were contained therein and the glass transition temperature of the polymer prepared from the mixture was −9° C., the pressure-sensitive adhesive sheet was prepared in the same manner as Example 1.

EXAMPLE 3

Except for the fact that a monomer mixture (100 parts by weight) comprising isobornyl acrylate, methyl acrylate, ethyl acrylate, n-butyl acrylate and 2-hydroxyethyl acrylate was used such that 20 parts by weight of isobornyl acrylate (IBOA) were contained therein and the glass transition temperature of the polymer prepared from the mixture was −1° C., the pressure-sensitive adhesive sheet was prepared in the same manner as Example 1.

EXAMPLE 4

Except for the fact that a monomer mixture (100 parts by weight) comprising isobornyl acrylate, methyl acrylate, ethyl acrylate, n-butyl acrylate and 2-hydroxyethyl acrylate was used such that 25 parts by weight of isobornyl acrylate (IBOA) were contained therein and the glass transition temperature of the polymer prepared from the mixture was 13° C., the pressure-sensitive adhesive sheet was prepared in the same manner as Example 1.

COMPARATIVE EXAMPLE 1

Except for the fact that a monomer mixture (100 parts by weight) comprising methyl acrylate, ethyl acrylate, n-butyl acrylate and 2-hydroxyethyl acrylate was used, and prepared such that the glass transition temperature of the polymer prepared from the mixture was −27° C., the pressure-sensitive adhesive sheet was prepared in the same manner as Example 1.

COMPARATIVE EXAMPLE 2

Except for the fact that a monomer mixture (100 parts by weight) comprising methyl acrylate, ethyl acrylate, n-butyl acrylate and 2-hydroxyethyl acrylate was used, and prepared such that the glass transition temperature of the polymer prepared from the mixture was −2° C., the pressure-sensitive adhesive sheet was prepared in the same manner as Example 1.

By using the prepared pressure-sensitive adhesive sheets according to examples and comparative examples, physical properties were evaluated in the following manner.

1. Adherence Property of Protective Film

The pressure-sensitive adhesive sheets were adhered to 8-inch silicon wafers using a wafer mounter (DS Precision Inc. DYWMDS-8') and the surface of the wafers was observed to calculate a portion where laminar bubbles were generated, after which an evaluation was made as ○ for 3 bubbles or less, Δ for 4 to 7 bubbles, and × for 8 bubbles or more.

2. 180° Release Force

Based on JIS Z 0237, 180° Release Force of the pressure-sensitive adhesive sheet was evaluated. First, the pressure-sensitive adhesive sheets were adhered to silicon wafers using a 2 kg roller and then kept at a temperature of 23° C. and a relative humidity of 55% for 1 hour. Then, the release force was evaluated at a release speed of 1.0 m/min by using a tensile tester. A specimen was used after being cut into a size of 2.5 cm×24 cm (horizontal×vertical).

3. Grinding Property

After the pressure-sensitive adhesive sheets were adhered to the 8-inch silicon wafers using the wafer mounter, the sheets were cut according to the wafer shape at the expender and then the amount of wafer damage and cracks was evaluated after using a back surface grinder (SVG-502MKII8). More specifically, grinding was performed 5 times and evaluation was made as ○ for 0 wafer cracks or damage, Δ for 1 wafer cracks or damage, and × for 2 wafer cracks or damage or more.

4. Water-Proofing Property

The water-proofing property of the pressure-sensitive adhesive sheets was evaluated based on the measurement of lifting. More specifically, the pressure-sensitive adhesive sheets were adhered to 8-inch silicon wafers and then cut into the wafer shape in the expender, after which a back-grinding process was performed by using the wafer back-grinder (SVG-502MKII8). Water penetration and lifting between the wafer surface and the pressure-sensitive adhesive sheet were evaluated according to the following criteria.

○: No lifting or release
Δ: Little lifting or release
×: Much lifting or release 5. Re-Release Property After the 8-inch silicon wafers were grinded to 150 μm, they were kept at room temperature for 24 hours, the surface to which a pressure-sensitive adhesive sheet was adhered was oriented upward on the flat plane and the pressure-sensitive adhesive sheet was released while safely supporting the grinded wafer. By evaluating cracks and damage in the wafer during release, the re-release property was evaluated according to the following criteria.

○: No cracks and damage in the wafer
Δ: A few cracks and damage in the wafer
×: A large quantity of cracks and damage in the wafer The results of measurement performed in the above manner are shown in Table 1.

TABLE 1

|  | Examples | | | | Comparative Examples | |
| --- | --- | --- | --- | --- | --- | --- |
|  | 1 | 2 | 3 | 4 | 1 | 2 |
| IBOA Content (Weight %) | 5 | 10 | 20 | 25 | — | — |
| Polymer Glass Transition Temperature (° C.) | −25 | −9 | −1 | 13 | −27 | −2 |
| Adherence Property | ○ | ○ | ○ | ○ | ○ | Δ |
| 180° Release Force (g/mm) | 46 | 42 | 35 | 27 | 87 | 71 |
| Grinding Property | ○ | ○ | ○ | ○ | ○ | Δ |
| Water-proofing Property | ○ | ○ | ○ | ○ | Δ | X |
| Re-release Property | ○ | ○ | ○ | ○ | X | Δ |

As can be seen from the results shown in Table 1, the examples of the present invention which use the pressure-sensitive adhesive polymer including isobornyl acrylate as a monomer component exhibit superior adherence, grinding, water-proofing, and re-release properties while maintaining 180° release force at an appropriate level. On the other hand, the comparative examples which do not include isobornyl acrylate exhibit excessively high release force and undergo significant degradation in other physical properties and the balance between physical properties.

What is claimed is:

1. A pressure-sensitive adhesive sheet that is a semiconductor processing sheet used as a protective film for semiconductor wafer backgrinding, which comprises:
    a base film; and
    a pressure-sensitive adhesive layer on one or both sides of the base film,
    wherein the pressure-sensitive adhesive layer contains a cured product of a pressure-sensitive adhesive composition,
    wherein the pressure-sensitive adhesive composition comprises a crosslinking agent and a polymer of a monomer mixture, wherein the monomer mixture comprises (a) (meth)acrylic acid alkyl ester monomer mixture consisting of 1 to 30 parts by weight of isobornyl (meth)acrylate and 60 to 98.9 parts by weight of (meth)acrylic acid alkyl ester monomer other than the isobornyl (meth)acrylate; and (b) a crosslinkable hydroxy group-containing or carboxyl group-containing monomer, wherein the polymer has a glass transition temperature of −50° C. to 15° C., and wherein the polymer is the only polymer comprised in the pressure-sensitive adhesive composition and wherein the pressure-sensitive adhesive layer has a crosslinking density of 80 to 99%.

2. The pressure-sensitive adhesive sheet that is a semiconductor processing sheet used as a protective film for semiconductor wafer backgrinding according to claim 1, wherein the base film has a toughness of less than 240 Kg·mm at 23° C. and a storage modulus of $1\times10^7$ to $1\times10^9$ Pa at 20° C.

3. A backgrinding method comprising:
    a first step of adhering the pressure-sensitive adhesive sheet of claim 1 to a semiconductor wafer; and
    a second step of grinding a back side of the semiconductor wafer to which the pressure-sensitive adhesive sheet is adhered.

4. A pressure-sensitive adhesive sheet that is a semiconductor processing sheet used as a protective film for semiconductor wafer backgrinding, which comprises:
    a base film; and
    a pressure-sensitive adhesive layer on one or both sides of the base film,
    wherein the pressure-sensitive adhesive layer contains a cured product of a pressure-sensitive adhesive composition,
    wherein the pressure-sensitive adhesive composition comprises a crosslinking agent and a polymer of a monomer mixture, wherein the monomer mixture comprises (a) (meth)acrylic acid alkyl ester monomer mixture consisting of 1 to 30 parts by weight of isobornyl (meth)acrylate and 60 to 98.9 parts by weight of (meth)acrylic acid alkyl ester monomer other than the isobornyl (meth)acrylate; and (b) a crosslinkable hydroxy group-containing monomer, crosslinkable carboxyl group-containing monomer, or mixture thereof,
    wherein the polymer has a glass transition temperature of −50° C. to 15° C., and
    wherein the polymer is the only polymer comprised in the pressure-sensitive adhesive composition and wherein the pressure-sensitive adhesive layer has a crosslinking density of 80 to 99%.

5. The pressure-sensitive adhesive sheet that is a semiconductor processing sheet used as a protective film for semiconductor wafer backgrinding according to claim 4, wherein the polymer has a weight average molecular weight of 50,000 to 700,000.

6. The pressure-sensitive adhesive sheet that is a semiconductor processing sheet used as a protective film for semiconductor wafer backgrinding according to claim 4, wherein the polymer has a glass transition temperature of −25° C. to 15° C.

7. The pressure-sensitive adhesive sheet that is a semiconductor processing sheet used as a protective film for semiconductor wafer backgrinding according to claim 4, wherein the base film has a toughness of less than 240 Kg·mm at 23° C. and a storage modulus of $1\times10^7$ to $1\times10^9$ Pa at 20° C.

8. A backgrinding method comprising:
    a first step of adhering the pressure-sensitive adhesive sheet of claim 4 to a semiconductor wafer; and
    a second step of grinding a back side of the semiconductor wafer to which the pressure-sensitive adhesive sheet is adhered.

9. A pressure-sensitive adhesive sheet that is a semiconductor processing sheet used as a protective film for semiconductor wafer backgrinding, which comprises:
    a base film; and
    a pressure-sensitive adhesive layer on one or both sides of the base film,
    wherein the pressure-sensitive adhesive layer contains a cured product of a pressure-sensitive adhesive composition,
    wherein the cured product of the pressure-sensitive adhesive composition is a thermally-cured crosslinked structure comprising a crosslinking agent and a polymer of a monomer mixture, wherein the monomer mixture comprises (a) (meth)acrylic acid alkyl ester monomer mixture consisting of 1 to 30 parts by weight of isobornyl (meth)acrylate and 60 to 98.9 parts by weight of (meth)acrylic acid alkyl ester monomer other than the isobornyl (meth)acrylate; and (b) a crosslinkable hydroxy group-containing or carboxyl group-containing monomer,
    wherein the polymer has a glass transition temperature of −50° C. to 15° C., wherein the polymer is the only polymer comprised in the pressure-sensitive adhesive composition and wherein the pressure-sensitive adhesive layer has a crosslinking density of 80 to 99%.

10. The pressure-sensitive adhesive sheet that is a semiconductor processing sheet used as a protective film for semiconductor wafer backgrinding according to claim 9, wherein the pressure-sensitive adhesive composition comprises 0.1 to 10 parts by weight of the crosslinking agent with respect to 100 parts by weight of the polymer.

11. The pressure-sensitive adhesive sheet that is a semiconductor processing sheet used as a protective film for semiconductor wafer backgrinding according to claim 9, wherein the crosslinking agent is one or more selected from the group consisting of an isocyanate compound, an epoxy compound, an aziridine compound, and a metal chelate compound.

12. The pressure-sensitive adhesive sheet that is a semiconductor processing sheet used as a protective film for semiconductor wafer backgrinding according to claim 9, wherein the base film has a toughness of less than 240 Kg·mm at 23° C. and a storage modulus of $1\times10^7$ to $1\times10^9$ Pa at 20° C.

13. A backgrinding method comprising:
    a first step of adhering the pressure-sensitive adhesive sheet of claim 9 to a semiconductor wafer; and
    a second step of grinding a back side of the semiconductor wafer to which the pressure-sensitive adhesive sheet is adhered.

14. A pressure-sensitive adhesive sheet that is a semiconductor processing sheet used as a protective film for semiconductor wafer backgrinding, which comprises:
    a base film; and
    a pressure-sensitive adhesive layer on one or both sides of the base film,
    wherein the pressure-sensitive adhesive layer is a thermally-cured crosslinked structure of a pressure-sensitive adhesive composition comprising a crosslinking agent and a polymer of a monomer mixture, wherein the monomer mixture comprises (a) (meth)acrylic acid alkyl ester monomer mixture consisting of 1 to 30 parts by weight of isobornyl (meth)acrylate and 60 to 98.9 parts by weight of (meth)acrylic acid alkyl ester monomer other than the isobornyl (meth)acrylate; and (b) a crosslinkable hydroxy group-containing monomer, crosslinkable carboxyl group-containing monomer, or mixture thereof,
wherein the polymer has a glass transition temperature of −50° C. to 15° C., and wherein the polymer is the only polymer comprised in the pressure-sensitive adhesive composition and wherein the pressure-sensitive adhesive layer has a crosslinking density of 80 to 99%.

15. The pressure-sensitive adhesive sheet that is a semiconductor processing sheet used as a protective film for semiconductor wafer backgrinding according to claim 14, wherein the pressure-sensitive adhesive composition comprises 0.1 to 10 parts by weight of the crosslinking agent with respect to 100 parts by weight of the polymer.

16. The pressure-sensitive adhesive sheet that is a semiconductor processing sheet used as a protective film for semiconductor wafer backgrinding according to claim 14, wherein the crosslinking agent is one or more selected from the group consisting of an isocyanate compound, an epoxy compound, an aziridine compound, and a metal chelate compound.

17. The pressure-sensitive adhesive sheet that is a semiconductor processing sheet used as a protective film for semiconductor wafer backgrinding according to claim 14, wherein the base film has a toughness of less than 240 Kg·mm at 23° C. and a storage modulus of $1 \times 10^7$ to $1 \times 10^9$ Pa at 20° C.

18. A backgrinding method comprising:
a first step of adhering the pressure-sensitive adhesive sheet of claim 14 to a semiconductor wafer; and
a second step of grinding a back side of the semiconductor wafer to which the pressure-sensitive adhesive sheet is adhered.

* * * * *